(12) United States Patent
Lou

(10) Patent No.: US 6,265,307 B1
(45) Date of Patent: Jul. 24, 2001

(54) FABRICATION METHOD FOR A DUAL DAMASCENE STRUCTURE

(75) Inventor: Chine-Gie Lou, Hsinchu Hsien (TW)

(73) Assignee: Taiwan Semiconductor Manufacturing, Co., Ltd., Hsinchu (TW)

( * ) Notice: Subject to any disclaimer, the term of this patent is extended or adjusted under 35 U.S.C. 154(b) by 0 days.

(21) Appl. No.: 09/606,798

(22) Filed: Jun. 29, 2000

(30) Foreign Application Priority Data

Jan. 12, 2000 (TW) .................................................. 89100399

(51) Int. Cl.<sup>7</sup> ................................................ H01L 21/4763
(52) U.S. Cl. ........................ 438/633; 438/618; 438/622; 438/634; 438/637; 438/638; 438/671; 438/783
(58) Field of Search .................................. 438/633, 622, 438/783, 618, 634, 638, 637, 671

(56) References Cited
U.S. PATENT DOCUMENTS

| | | | | |
|---|---|---|---|---|
| 5,906,911 | * | 5/1999 | Cote ..................................... | 430/316 |
| 5,933,761 | * | 8/1999 | Lee ...................................... | 438/783 |
| 5,980,657 | * | 11/1999 | Farrar et al. ........................ | 148/438 |
| 6,103,616 | * | 8/2000 | Yu et al. ............................. | 438/622 |

* cited by examiner

Primary Examiner—Richard Elms
Assistant Examiner—Pho Luy
(74) Attorney, Agent, or Firm—Jiawei Huang; J.C. Patents

(57) ABSTRACT

A dual damascene manufacturing process, which is applicable to a dual damascene structure, is described. The method includes forming sequentially a first organic dielectric layer with a low dielectric constant, a thermal diffusion layer and a second organic dielectric layer with a low dielectric constant on a substrate. A first mask layer with a trench line pattern and a second mask layer with a via opening pattern are then formed on the substrate, respectively. The second organic dielectric layer with a low dielectric constant and the thermal diffusion layer are etched using the second mask layer as a hard mask layer to transfer the via opening pattern onto the thermal diffusion layer, and the second mask layer is then removed. The first and the second organic dielectric layer with a low electric constant are removed by using the first mask layer and the thermal diffusion layer as hard mask layers to form a trench line and a via opening. After that, the dual damascene structure is completed.

19 Claims, 8 Drawing Sheets

FABRICATION METHOD FOR A DUAL DAMASCENE STRUCTURE

CROSS-REFERENCE TO RELATED APPLICATION

This application claims the priority benefit of Taiwan application serial no. 89100399, filed Jan. 12, 2000.

BACKGROUND OF THE INVENTION

1. Field of Invention

The present invention relates to a fabrication method for a multilevel metal interconnects in a semiconductor device. More particularly, the present invention relates to a fabrication method for a dual damascene structure.

2. Description of Related Art

In the development of the semiconductor industry, a goal of a high operational speed for electronic devices is actively pursued by all semiconductor manufacturers and customers. The factors such as the resistance of conductive lines and the formation of parasitic capacitance caused by unnecessary capacitive coupling between the adjacent conductive wires are decisive for the operational speed of devices. A metal with a low resistance for the decrease of resistance and a dielectric material with a low dielectric constant for the improvement of the issue of parasitic capacitance have been chosen for use in the manufacturing of semiconductor devices.

The typical metallic interconnect manufacturing process includes forming a metal plug in the dielectric layer. The second aluminum layer of the metal-interconnect structure is electrically connected to the base layer of metal-interconnect structure via the metal plug formed in the dielectric layer. The dual damascene technique includes a metallic interconnect technique with high reliability and low cost, and the metallic interconnect materials are protected from, etching. The dual damascene technique has been widely applied in the manufacturing of copper line to reduce the resistance of conductive lines, and further improve the operational speed and quality of an integrated circuit. In order to accommodate the demand for high operational speed, dielectric layers with a low dielectric constant have been employed in manufacturing dual damascene structures, which have gradually become the metallic interconnect technique in the semiconductor industry.

FIGS. 1A to 1E are schematic, cross-sectional views showing the dual damascene manufacturing process according to the prior art.

Referring to FIG. 1A, a dielectric layer 102 is formed on a substrate 100, followed by forming a silicon nitride layer 104 to cover the dielectric layer 102. A patterned photoresist 106 with a via opening pattern 108 is further formed to cover the silicon nitride layer 104.

Referring to FIG. 1B, the silicon nitride layer 104 is etched with the photoresist layer 106 serving as a mask to transfer the via opening pattern 108 of the photoresist layer 106 to the silicon nitride layer 104. Thus a via opening 110 is formed in the silicon nitride layer 104. Another inter-metal dielectric layer 112 is formed over the substrate 100 and then a patterned photoresist layer 114 with a trench line pattern 116 is formed over the inter-metal dielectric layer 112.

Referring to FIG. 1C, the portion of the inter-metal dielectric layer 112 uncovered by the patterned photoresist 114 is etched to form a trench line 120. After exposure of the portion of the silicon nitride layer 104 with a via opening 110, etching is further conducted on the exposed dielectric layer 102 under the via opening 110 to form a via 118 in the dielectric layer 102.

Continuing to FIG. 1D and FIG. 1E, the photoresist layer 114 is removed by ashing using $O_2$ plasma. A metal layer 122 is formed on the substrate 100 and fills the trench 120 and the via 118. Portions of the metal layer 122 which are covering the surface of the dielectric layer 112 are removed by, for example, chemical mechanical polishing (CMP), leaving the metal layer 122 in the trench 120 and in the via 118. At this point, the manufacturing of a dual damascene structure is completed.

As the integration of the devices increases, the density of wires used to electrically couple the transistors or other devices is increased. The issues of parasitic capacitance between the adjacent conductive wires becomes serious. Therefore, at the stage of deep submicron manufacturing, the dielectric constant of the IMD layer is lowered to reduce the parasitic capacitance and therefore to decrease the resistance-capacitance (RC) time delay when electronic signals are being transmitted between the metal lines.

However, the photoresist layer usually contains polymer material while a dielectric material having a low dielectric constant, such as organic polymer, is commonly used. According to the above manufacturing process, during the process of removing the photoresist layer 114 by ashing using oxygen plasma, the organic dielectric material 112 and 102 with a low dielectric constant will be damaged by oxygen plasma. Therefore, moisture is adsorbed on the sidewalls of the trench line 120 and the via opening 118, respectively formed in the organic dielectric material 112 and 102 with a low dielectric constant. As shown in FIG. 1D, moisture is adsorbed on the sidewalls labeled 124 and 126. In the subsequent thermal process, the adsorbed moisture escapes from the sidewalls of the trench line 120 and the via 118, so that the performance when filling the via 118 and the trench 120 with the metal layer 122 is poor due to the adsorbed moisture, resulting in a poisoned via and trench effect.

In addition, according to the prior art, the trench line 120 and via 118 are formed by performing anisotropic etching with the silicon nitride layer 104 serving as an etch-stop layer and as an etching mask, respectively. However, the silicon nitride layer 104 has a dielectric constant of about 7. Effects, such as the increase of the RC delay time contributed by the generation of the parasitic capacitance between the adjacent conductive wires become serious. As a result, the operational speed of a highly integrated circuit is limited.

SUMMARY OF THE INVENTION

The present invention provides a fabrication method for a dual damascene structure that prevents dielectric material with a relatively low dielectric constant from suffering moisture adsorption during the process of removing a photoresist. Therefore, the poisoned via and trench effect can be avoided.

The present invention further provides a fabrication method for a dual damascene structure that decreases parasitic capacitance between the adjacent conductive wires to accelerate the operation speed of the IC device.

Accordingly, the present invention provides a fabrication method for a dual damascene structure. The substrate having a first organic dielectric layer with a low dielectric constant, a thermal diffusion layer and a second organic dielectric layer with a low dielectric constant formed thereon is provided. Thereafter, a first and a second etching mask layers with a trench line pattern and a via opening pattern, respectively, are sequentially formed on the substrate. The second organic dielectric layer with a low dielectric constant and the thermal diffusion layer are etched while using the second etching mask layer as a hard mask; then the via opening is formed in the thermal diffusion layer. Thereafter, the second etching mask layer is removed. While using the first etching mask layer and the thermal diffusion layer as hard masks, the second and the first organic dielectric layers with a low dielectric constant are further etched; then a via opening is formed in the first organic dielectric layer and a trench line is formed in the second organic dielectric layer. The via opening and the trench line are then filled with a conductive material and a chemical mechanical polishing process is subsequently performed to remove a portion of the conductive material to form a metal line and via.

As embodied and broadly described herein, the dual damascene structure is formed by using two patterned photoresist layers serving as mask layers to transfer two patterns onto the etching mask layers. The first etching mask layer possesses a trench line pattern and the second etching mask layer possesses a via opening pattern.

After the trench line pattern of the first photoresist layer is transferred to the first etching mask layer, the first photoresist layer with a trench line pattern is removed by ashing using oxygen plasma to expose the second organic dielectric layer with a low dielectric constant. During the oxygen plasma process, the surface of the second organic dielectric layer is damaged. However, the damaged portion of the surface is removed in the subsequent etching process to form the trench. Therefore, the process of removing the first photoresist layer does not substantially affect the result of a dual damascene structure.

Meanwhile, after the via opening pattern of the second photoresist layer is transferred to the second etching mask layer, the second photoresist layer is removed by ashing using oxygen plasma. The exposed surface of the second organic dielectric layer with a low dielectric constant is also damaged by the attack of oxygen plasma. However, the damaged portion of the surface is also removed in the subsequent etching process. In fact, the process of removing the second photoresist layer does not affect the result of a dual damascene structure.

According to the present invention, before the formation of the via opening and the trench line in the first and the second organic dielectric layer with a low dielectric constant, respectively, the damaged portion of the second organic dielectric layer is already removed in the subsequent etching process. After the formation of the via opening and the trench line in the first and the second organic dielectric layer, respectively, the step of removing the photoresist layer is not included in the manufacturing process. Therefore, the adsorption of the moisture in the sidewalls of the via opening and the trench line formed in the first organic dielectric layer and the second organic dielectric layer can be avoided. Hence, in the subsequent process of the deposition of the metal layer, the poisoned via and trench effect caused by the evaporation of the adsorbed moisture is avoided.

In addition, according to a preferred embodiment of the present invention, the material of the second etching mask layer is made of silicon nitride with a high dielectric constant, but the silicon nitride layer is removed by conducting the subsequent etching process. Hence, according to the present invention, the dual damascene structure does not comprise a silicon nitride layer. Furthermore, the silicon nitride layer of the prior art method is replaced with the thermal diffusion layer of aluminum nitride with a low dielectric constant and located between the two organic dielectric layers. Therefore, in the present invention, the parasitic capacitance between adjacent conductive wires is reduced and the performance of the devices is improved.

Meanwhile, the aluminum nitride layer possesses an excellent heat-dissipation characteristic so that the heat produced by the metal lines in the process of high operational speed in the integrated circuits can be dissipated; thus the reliability of devices can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2J are schematic, cross-sectional views showing the dual damascene manufacturing process according to one preferred embodiment of this invention.

Figure 1A:
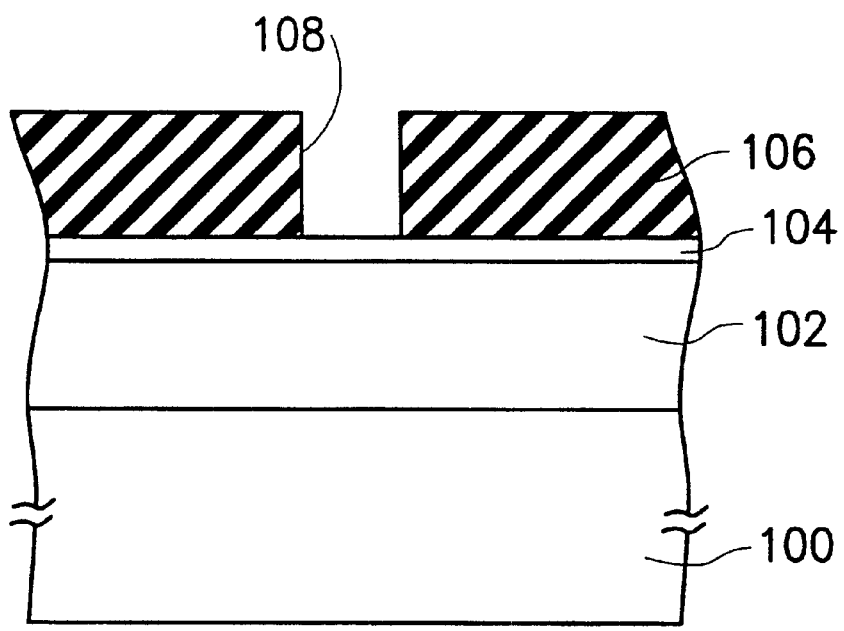
FIGS. 1A to 1E are schematic, cross-sectional views showing the dual damascene manufacturing process according to the prior art.
Figure 1B:
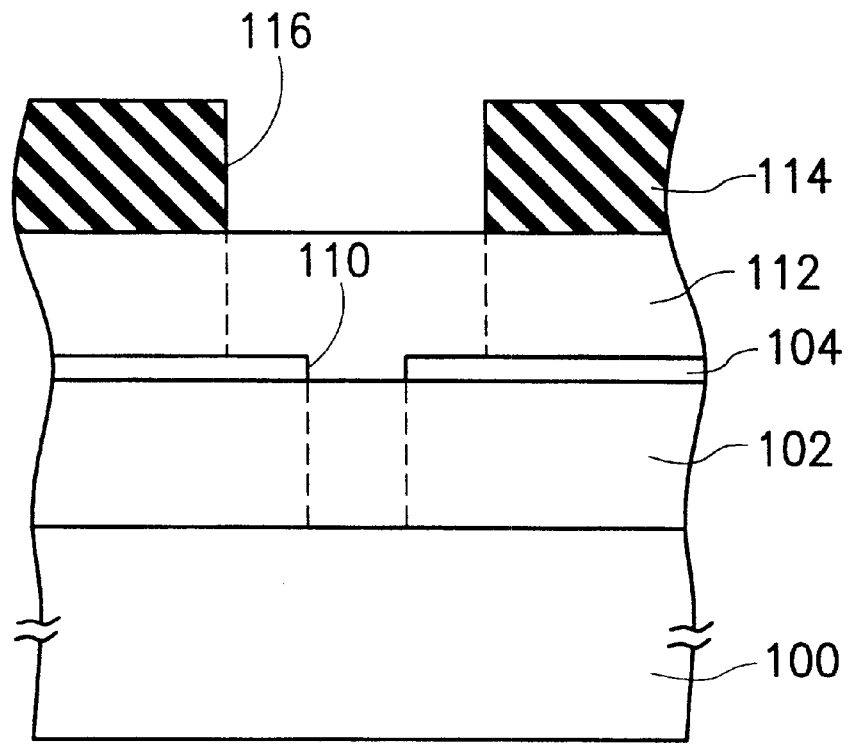
Figure 1C:
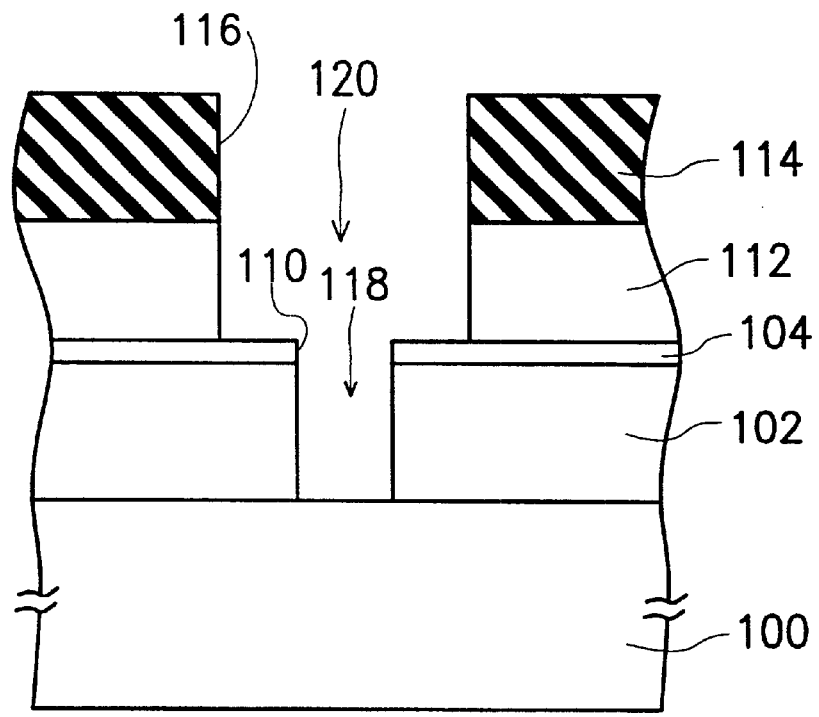
Figure 1D:
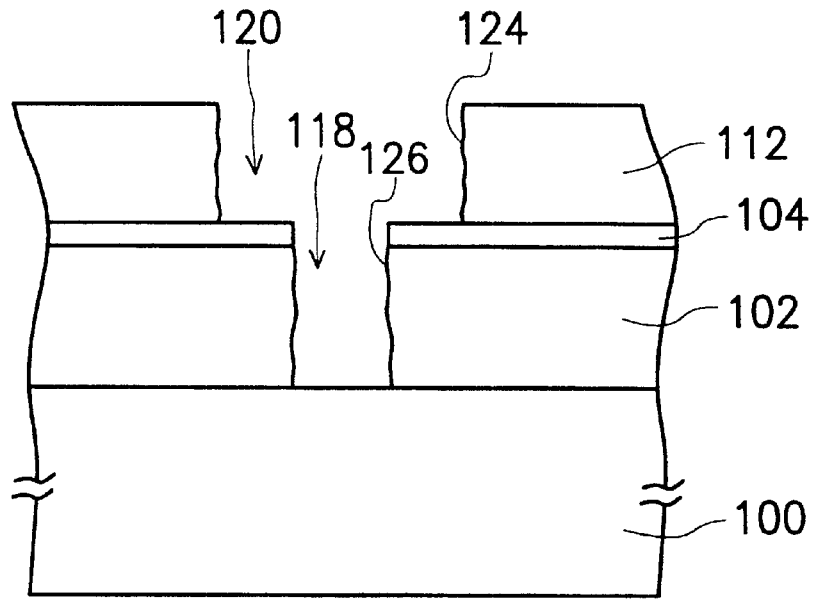
Figure 1E:
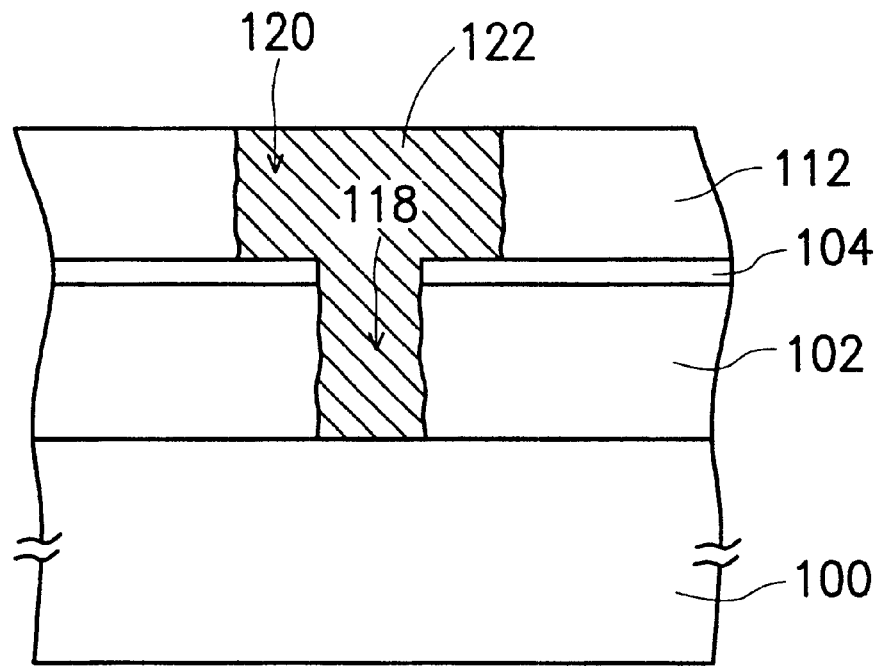
Figure 2A:
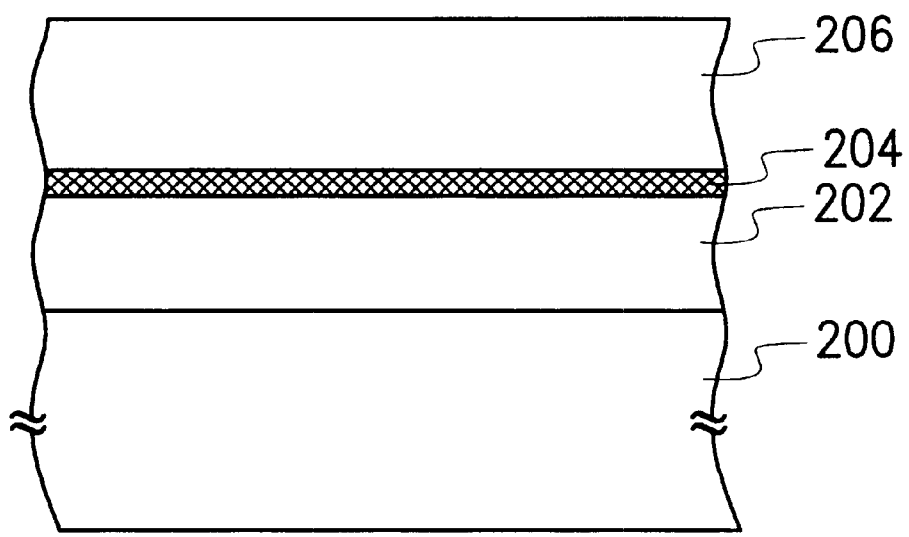
FIGS. 2A to 2J are schematic, cross-sectional views showing the dual damascene manufacturing process according to one preferred embodiment of this invention.

Referring to FIG. 2A, a substrate 200 is provided with a dielectric layer 202, a thermal diffusion layer 204 and a dielectric layer 206 formed in sequence thereon. Preferably, the dielectric layers 202, 206 with a low dielectric constant comprise spin on organic polymers. The thickness of the dielectric layer 202 is preferably about 2000–5000 angstroms, and the thickness of the dielectric layer 206 is preferably about 2500–5000 angstroms. Preferably, the thermal diffusion layer 204 has excellent heat-dissipation characteristic and a low dielectric constant that is preferably less than 4. In addition, the etching rate of the thermal diffusion layer 204 is different from those of dielectric layers 202 and 206 with respect to a particular etchant. The thermal diffussion layer 204 is, for example, aluminum nitride and is formed by, for example, physical vapor deposition, with a thickness of about 500–2000 angstroms.

Figure 2B:
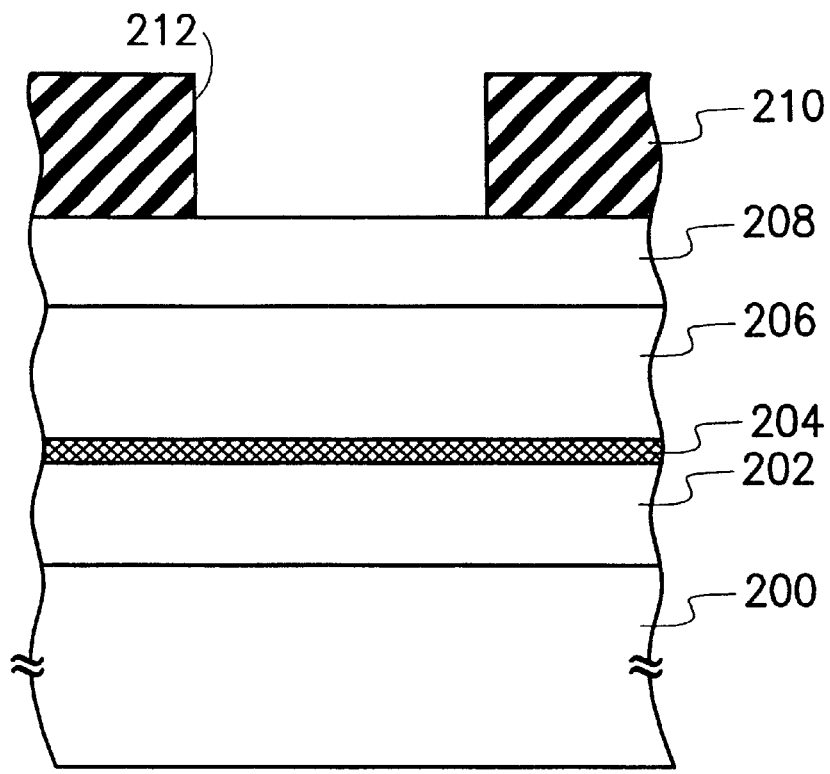

Referring to FIG. 2B, a mask layer 208 is formed on the dielectric layer 206. The etching rate of the mask layer 208 is different from those of the dielectric layers 202 and 206 with respect to a particular etchant. Preferably, the mask layer 208 is, for example, titanium nitride, and is formed by, for example, chemical vapor deposition or physical vapor deposition, with a thickness of about 500–2000 angstroms. The photoresist layer 210 with a trench line pattern 212 is formed on the mask layer 208 to define the mask layer 208.

Figure 2C:
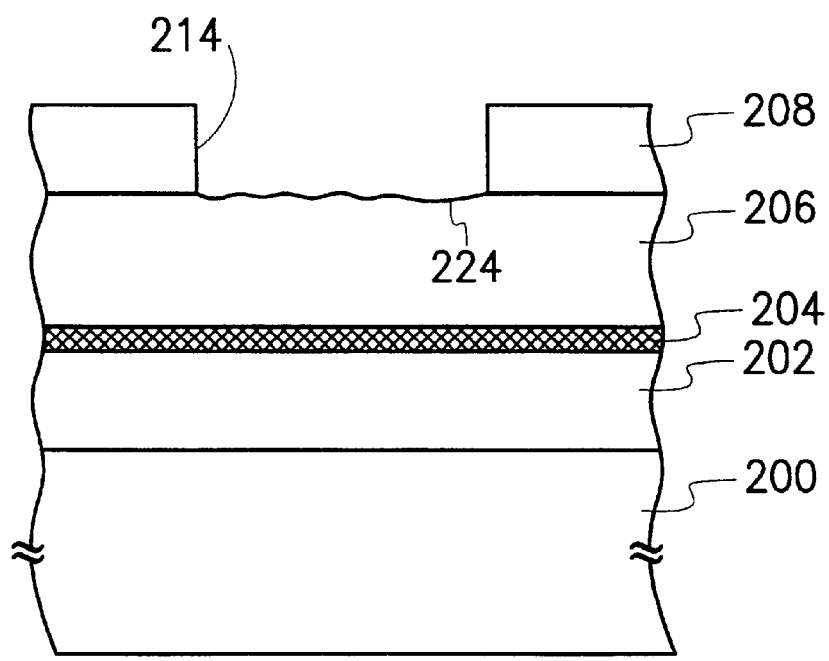

Referring to FIG. 2C, a portion of the mask layer 208 uncovered by the photoresist layer 210 is etched while using the patterned photoresist layer 210 as a mask layer and the dielectric layer 206 as an etching stop layer. Then, a trench line 214 is formed in the mask layer 208 and a portion of the dielectric layer 206 is exposed. The photoresist layer 210 is then removed by, for example, ashing and wet etching.

Continuing with reference to FIG. 2C, the photoresist 210 is removed by ashing using oxygen plasma to expose the patterned mask layer 208. The exposed surface of the dielectric layer 206 under the trench line 214 is uncovered by the patterned mask layer 208, so that the surface of the exposed dielectric layer 206, labeled as 224, is easily damaged by the attack of oxygen plasma. However, the damaged surface 224 is removed by subsequent etching step, so that the formation of the dual damascene structure is not affected.

Figure 2D:
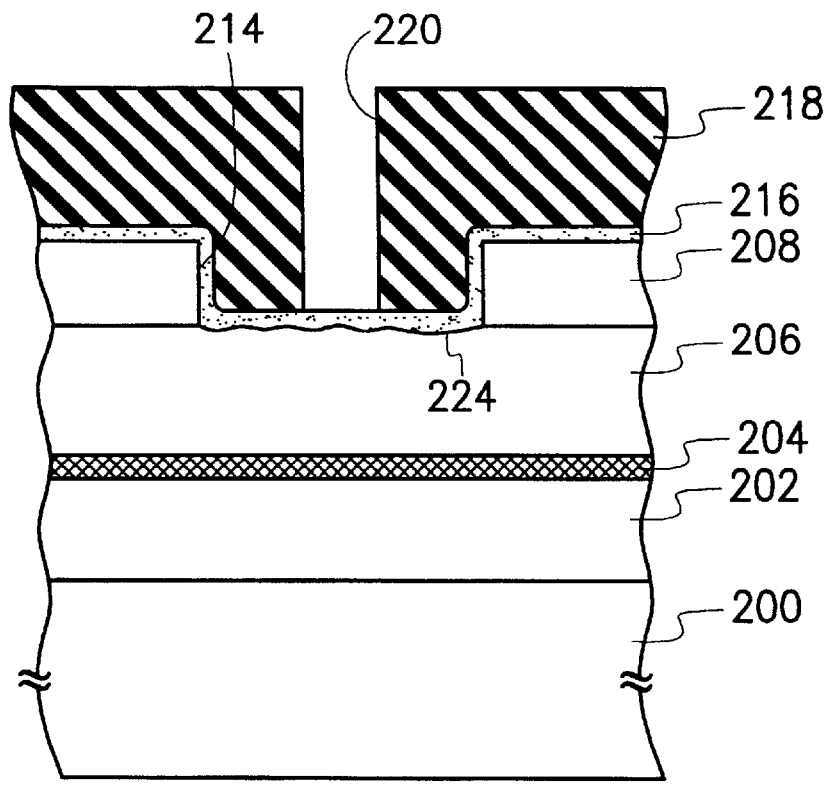

Referring to FIG. 2D, a mask layer 216 is formed on the substrate 200 to cover the exposed mask layer 208 and dielectric layer 206. The etching rate of the mask layer 216 is different from those of the dielectric layer 206 and the thermal diffusion layer 204. Preferably, the mask layer 216 is, for example, silicon nitride and is formed by, for example, chemical vapor deposition, with a thickness of about 500–2000 angstroms.

Then, a photoresist layer 218 with a via opening pattern 220 is formed on the substrate 200 to expose a portion of the mask layer 216 covering the trench line 214.

Figure 2E:
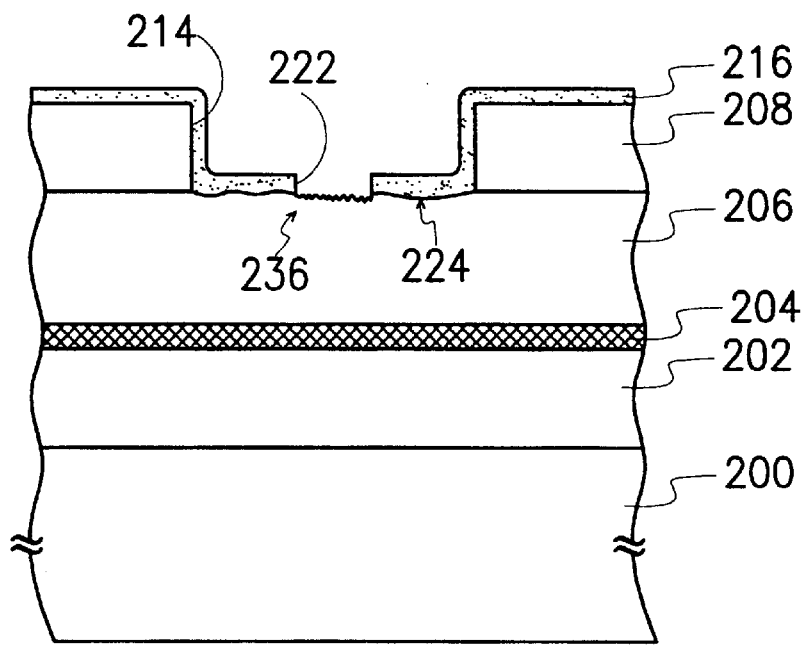

Referring to FIG. 2E, using the photoresist layer 218 with a via opening pattern 220 as an etching mask, the exposed mask layer 216 not covered by the photoresist layer 218 is removed by, for example, reactive ion etching to transfer the via opening pattern 220 to the mask layer 216. Therefore, an opening 222 is formed in the mask layer 216, and the patterned photoresist layer 218 is then removed by ashing using oxygen plasma.

In the same way, the exposed surface of the dielectric layer 206 uncovered by the patterned mask layer 216, labeled as 236, is damaged by the attack of oxygen plasma. However, the damaged surface 236 of dielectric layer 206 is removed by the subsequent etching step, so that the formation of dual damascene structure is not affected.

Figure 2F:
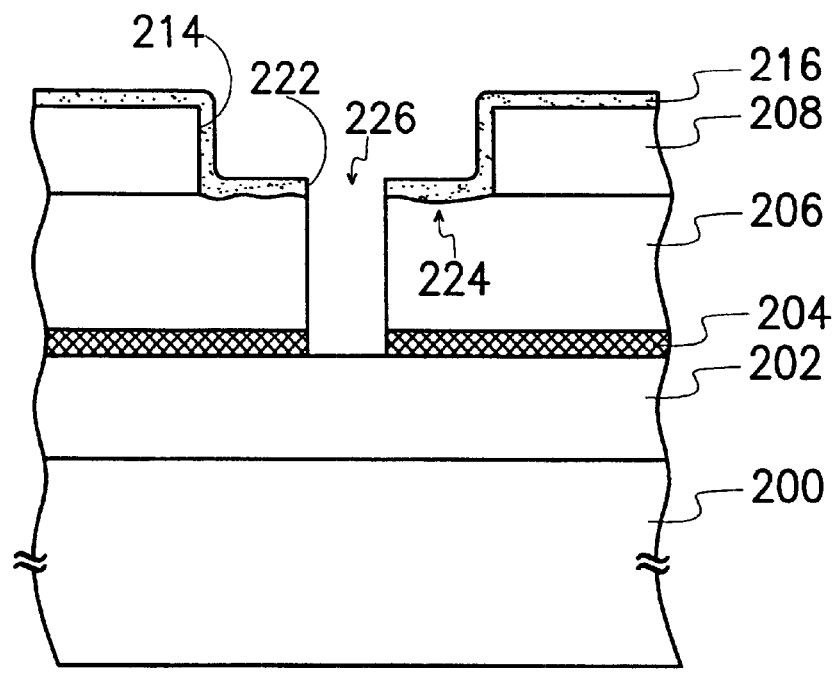

Referring to FIG. 2F, with the mask layer 216 serving as a hard mask, anisotropic etching, for example, reactive ion etching is sequentially conducted on the exposed dielectric layer 206 and the thermal diffusion layer 204. The opening 222 pattern is transferred to the dielectric layer 206 and the thermal diffusion layer 204, and a via opening 226 is formed in the thermal diffusion layer 204 and the dielectric layer 206. Furthermore, the damaged surface 236 of dielectric layer 206 is removed by the etching step.

Figure 2G:
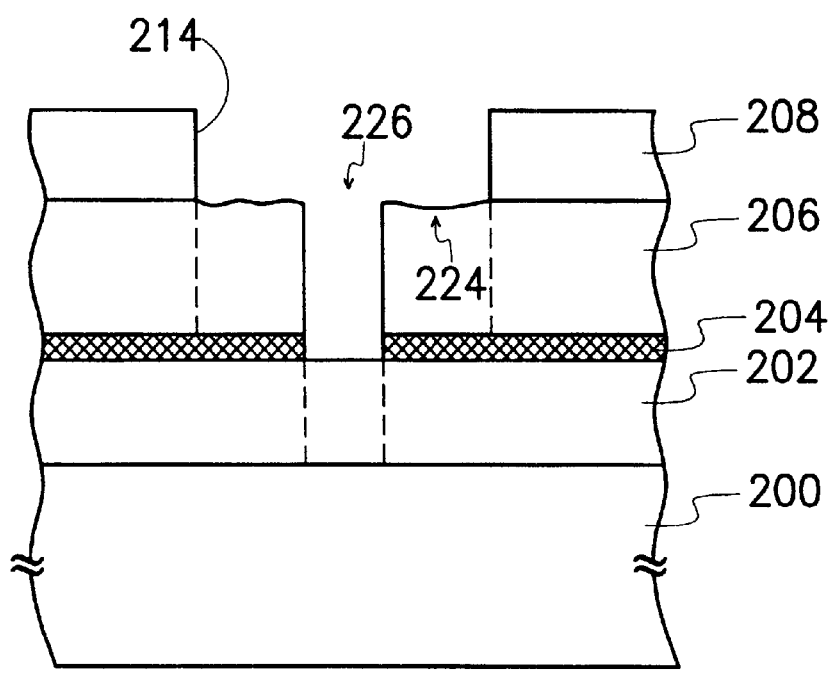

Referring to FIG. 2G, after removing the mask layer 216, a trench line 214 is formed in the mask layer 208, and a via opening 226 is formed in the dielectric layer 206 and the thermal diffusion layer 204, concurrently. Then, a model of an opening of a dual damascene structure is reached.

Figure 2H:
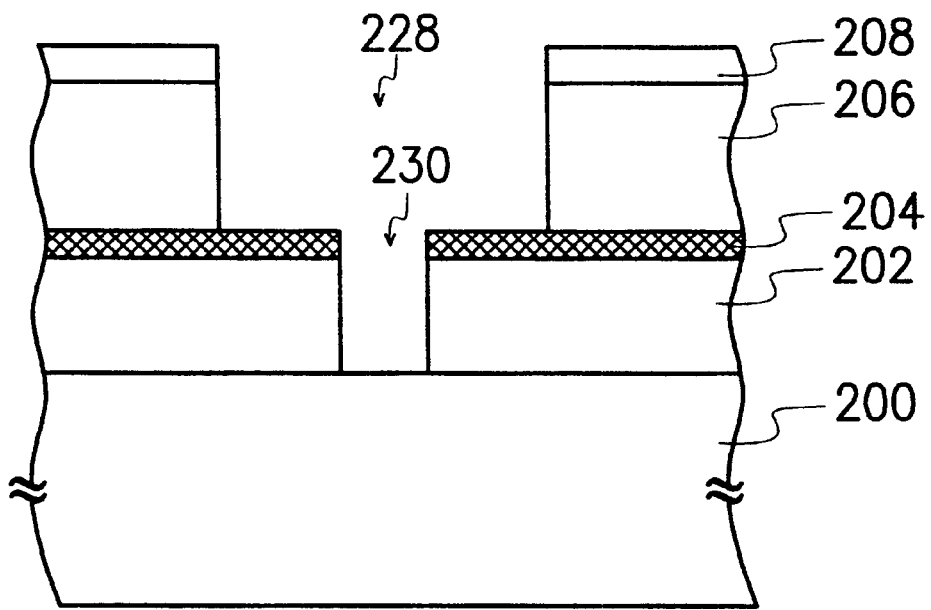

Referring to FIG. 2H, with the mask layer 208 serving as a hard mask and the thermal diffusion layer 204 serving as a hard mask and etching stop layer, anisotropic etching, for example, reactive ion etching is conducted on the portion of the dielectric layer 206 uncovered by mask layer 208 and the portion of the dielectric layer 202 uncovered by thermal diffusion layer 204. Then, the trench line pattern 214 in the mask layer 208 is transferred to the dielectric layer 206 to form a trench line 228 in the dielectric layer 206. A via opening pattern 226 in the dielectric layer 206 and thermal diffusion layer 204 is transferred to the dielectric layer 202 to form a via opening 230 in the dielectric layer 202.

Briefly, the above method includes only one etching process. The trench line pattern 214 in the mask layer 208 and the via opening pattern 226 in the dielectric layer 206 and the thermal diffusion layer 204 are concurrently duplicated into the dielectric layer 206 and the dielectric layer 202, respectively, to form the trench line 228 and the via opening 230 of dual damascene structure.

According to the above etching process, the exposed surface of the dielectric layer 206 is damaged during the removal of photoresist layer 210, but the damaged portion of surface 224 is removed by the reactive ion etching. However, the sidewalls of the via opening 230 in the dielectric layer 202 and the trench line 228 in the dielectric layer 206 are not damaged by the attack of oxygen plasma.

Figure 2I:
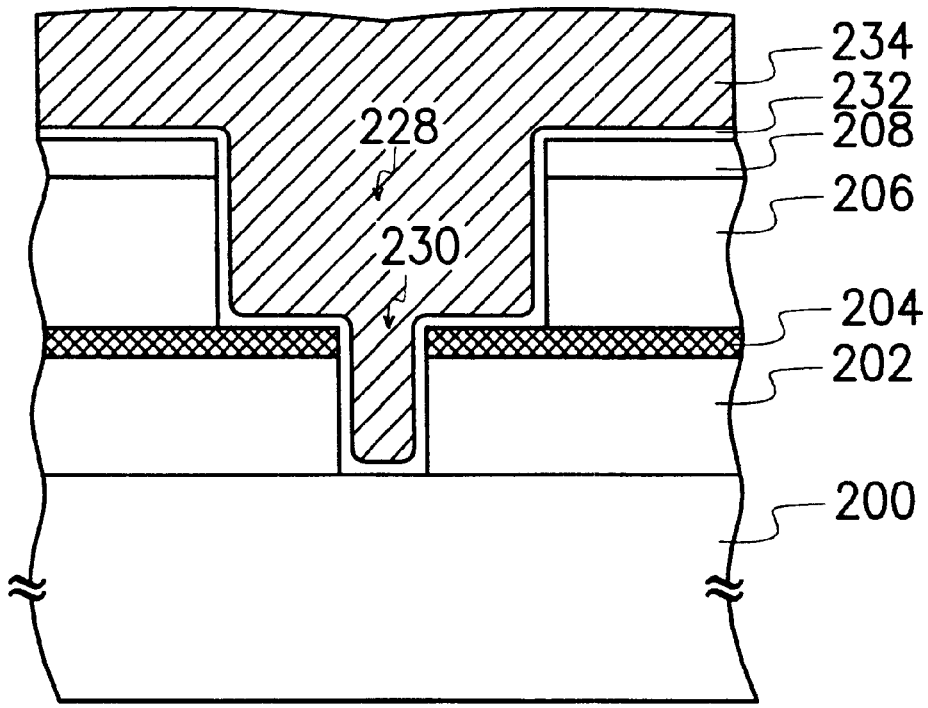

Referring to FIG. 2I, a barrier layer 232 is formed over the substrate 200 to cover the surface of the mask layer 208, the trench 228, and the via opening 230. The barrier layer 232 comprises, for example, titanium nitride, tantalum nitride or the same type of materials and is formed by, for example, chemical vapor deposition. Thereafter, the metal layer 234 is formed on the substrate 200, covering the barrier layer 232 and filling the via opening 230 and the trench line 228. The metal layer 234 is, for example, copper and is formed by, for example, chemical vapor deposition or physical vapor deposition.

Figure 2J:
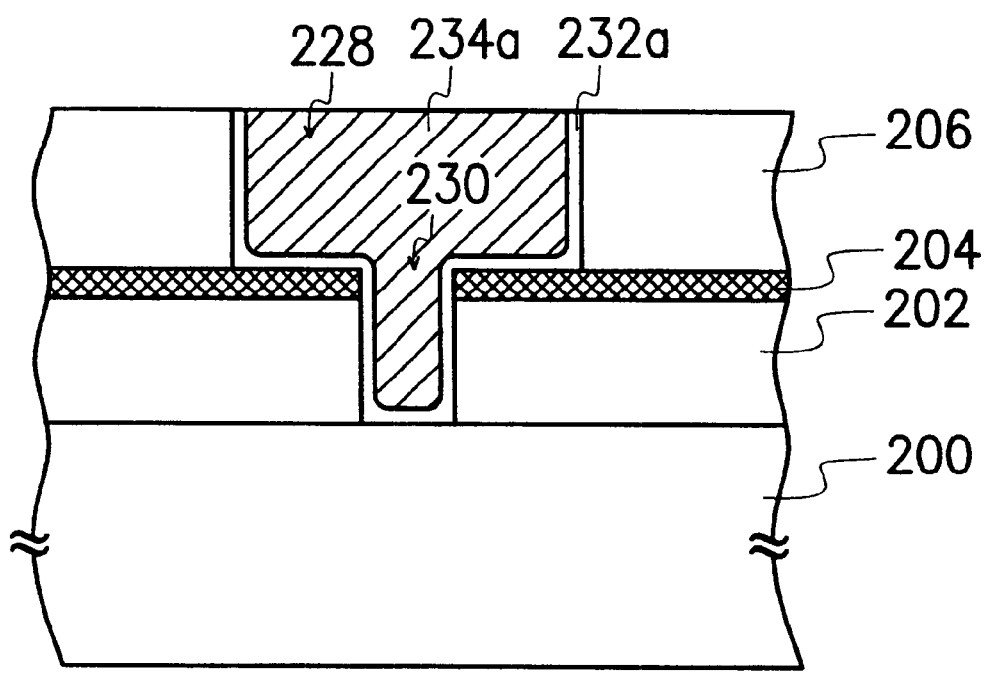

Continuing to FIG. 2J, the dielectric layer 206 serving as a polishing stop layer, the metal layer 234, the barrier layer 232 and the mask layer 208 above the dielectric layer 206 are removed by, for example, chemical mechanical polishing, leaving the metal layer 234a and the barrier layer 232a in the trench line 228 and via opening 230. After that, the process for manufacturing the dual damascene structure is completed.

The present invention provides a fabrication method for a dual damascene. The trench line pattern and the via opening pattern are transferred by using two photoresist layers 210 and 218 in the photolithography process. The titanium nitride layer 208 with the trench line pattern 214 and the silicon nitride layer 216 with the via opening pattern 222 serving as mask layers.

The trench line pattern 212 on the photoresist layer 210 is transferred to the titanium nitride mask layer 208, and then the photoresist layer 210 is removed using oxygen plasma to expose the dielectric layer 206 with a low dielectric constant. The exposed surface of the dielectric layer 206 can be damaged by the attack of oxygen plasma, but the damaged surface 224 is removed by the subsequent etching process, and a trench line 228 is formed. Therefore, the dual damascene structure is not changed during the process of removing the photoresist layer 210.

Meanwhile, the via opening pattern 220 of the second photoresist layer 218 is transferred to the silicon nitride mask layer 216. The second photoresist layer 218 is removed using oxygen plasma to expose the portion of the surface of the organic dielectric layer 206 with a low dielectric constant. The exposed surface of the second dielectric layer 206 can be damaged by the attack of oxygen plasma, but the damaged surface 236 is removed by the subsequent etching process. In fact, the dual damascene structure is not changed during the process of removing the second photoresist layer 218.

According to the present invention, before the formation of the via opening 230 and the trench line 228 in the first organic dielectric layer 202 and the second organic dielectric layer 206 with a low dielectric constant, respectively, the damaged portions 224, 236 of the second organic dielectric layer are already removed in the subsequent etching process. After the formation of the via opening 230 and the trench line 228 in the first organic dielectric layer 202 and the second organic dielectric layer 206, respectively, the step of removing the photoresist layer is not included in the manufacturing process. Therefore, the adsorption of the moisture by the sidewalls of the via opening 230 and the trench line 228 formed in the first organic dielectric layer 202 and the second organic dielectric layer 206 can be avoided. Hence, in the subsequent process of the deposition of the metal layer 234, the poisoned via and trench effect caused by the evaporation of the adsorbed moisture is avoided.

In addition, according to the present invention, the material of the second etching mask layer 216 is made of silicon nitride with a high dielectric constant, but the silicon nitride layer 216 is removed by conducting the subsequent etching process. Hence, according to the present invention, the dual damascene structure does not comprise a silicon nitride layer. Furthermore, the silicon nitride layer of the prior art method is replaced with the thermal diffusion layer of aluminum nitride with a low dielectric constant and located between the two organic dielectric layers. Therefore, in the present invention, the parasitic capacitance between adjacent conductive wires is reduced and the performance of the devices is improved.

Meanwhile, the aluminum nitride layer possesses an excellent heat-dissipation characteristic so that the heat produced by the metal lines due to the high operational speed processing of the integrated circuits can be dissipated, thus the reliability of devices can be improved.

Accordingly, the invention includes the following advantages:

1. According to the present invention, the poisoned via and trench effect can be avoided.

2. According to the present invention, the parasitic capacitance between the adjacent conductive lines is reduced and the performance ability of the devices is improved.

3. According to the present invention, the heat produced by the metal lines due to the high operational speed processing of the integrated circuits can be dissipated; thus the reliability of devices can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene manufacturing method, which is applicable to a dual damascene structure, comprising the steps of:

providing a substrate having a first dielectric layer, a thermal diffusion layer and a second dielectric layer formed in sequence thereon;

forming a first mask layer on the second dielectric layer, the first mask layer having a trench line pattern to expose a first portion of the second dielectric layer;

forming a second mask layer to cover the first mask layer and the exposed first portion of the second dielectric layer, the second mask layer having a via opening pattern therein to expose a second portion of the second dielectric layer;

removing the second dielectric layer and the thermal diffusion layer using the second mask layer with the via opening pattern serving as a hard mask until a surface of the first dielectric layer is exposed to form a via opening in the second dielectric layer and the thermal diffusion layer;

removing the second mask layer;

removing the second dielectric layer uncovered by the first mask layer and the first dielectric layer uncovered by the thermal diffusion layer to form a trench line in the second dielectric layer and a via opening in the first dielectric layer, wherein the first mask layer and the thermal diffusion layer serve as a hard mask layer;

forming a metal layer in the trench line and the via opening; and removing the first mask layer.

2. The method of claim 1, wherein an etching rate of the first mask layer is different from that of the first dielectric layer and the second dielectric layer.

3. The method of claim 2, wherein the first mask layer includes titanium nitride, the first dielectric layer and the second dielectric layer include an organic dielectric layer with a low dielectric constant.

4. The method of claim 1, wherein an etching rate of the second mask layer is different from that of the second dielectric layer and the thermal diffusion layer.

5. The method of claim 4, wherein the second mask layer includes silicon nitride and the thermal diffusion layer includes aluminum nitride.

6. The method of claim 1, wherein the first dielectric layer and the second dielectric layer include organic polymers with a low dielectric constant.

7. The method of claim 1, wherein a dielectric constant of the thermal diffusion layer is less than 4.

8. The method of claim 1, wherein the steps of forming the first mask layer include:

forming a material layer on the substrate;

forming a photoresist layer on the material layer, the photoresist layer having a trench line pattern;

etching the material layer with the photoresist layer serving as a mask layer to transfer the trench line pattern onto the material layer to form the first mask layer; and removing the photoresist layer.

9. The method of claim 8, wherein the material layer includes titanium nitride and the second dielectric layer includes organic material with a low dielectric constant.

10. The method of claim 9, wherein the photoresist layer is removed by ashing using oxygen plasma.

11. The method of claim 1, wherein the steps of forming the second mask layer include:

forming a material layer on the substrate;

forming a photoresist layer on the material layer, the photoresist layer having a via opening pattern;

etching the material layer with the photoresist layer serving as a mask layer to transfer the via opening pattern onto the material layer to form the second mask layer; and removing the photoresist layer.

12. The method of claim 11, wherein the material layer includes silicon nitride and the second dielectric layer includes organic material with a low dielectric constant.

13. The method of claim 12, wherein the photoresist layer is removed by ashing using oxygen plasma.

14. The method of claim 1, wherein the steps of forming the metal layer in the trench line and the via opening include:

forming a metal material on the substrate to fill the trench line and the via opening; and removing the metal material above the first mask layer by chemical mechanical polishing, leaving a metal material in the trench line and the via opening to form the metal layer.

15. The method of claim 14, wherein a barrier layer is formed on the substrate before the formation of the metal material.

16. A dual damascene manufacturing method, which is applicable to a dual damascene structure, comprising the steps of:

providing a substrate having a first organic dielectric layer with a low dielectric constant, an aluminum nitride layer and a second organic dielectric layer with a low dielectric constant formed in sequence thereon;

forming a titanium nitride layer on the second dielectric layer with a low dielectric constant;

forming a first photoresist layer with a trench line pattern on the titanium nitride layer;

etching the titanium nitride layer while using the first photoresist layer as a mask layer to transfer the trench line pattern to the titanium nitride layer, wherein the titanium nitride layer with a trench line pattern is formed to expose the second organic dielectric layer;

removing the first photoresist layer;

forming a silicon nitride layer to cover the titanium nitride layer and the exposed second organic dielectric layer with a low dielectric constant;

forming a second photoresist layer with a via opening pattern on the silicon nitride layer;

etching the silicon nitride layer while using the second photoresist layer as a mask layer to transfer the via opening pattern onto the silicon nitride layer to expose a portion of the second organic dielectric layer with a low dielectric constant;

removing the second photoresist layer;

removing the exposed portion of the second organic dielectric layer and the aluminum nitride layer concurrently through the via opening pattern to form a via opening in the second organic dielectric layer with a low dielectric constant and the aluminum nitride layer;

removing the silicon nitride layer;

removing the second organic dielectric layer with a low dielectric constant uncovered by the titanium nitride layer and removing the first organic dielectric layer with a low dielectric constant uncovered by the aluminum nitride layer to form a trench line in the second organic dielectric layer and a via opening in the first organic dielectric layer;

forming a metal layer in the trench line and the via opening; and removing the titanium nitride layer.

17. The method of claim 16, wherein the first photoresist layer and the second photoresist layer are removed by oxygen plasma.

18. The method of claim 16, wherein the step of forming the metal layer in the trench line and the via opening further includes:

forming a metal material on the substrate to fill the trench line and the via opening; and removing the metal material over the titanium nitride layer by chemical mechanical polishing and leaving the metal material in the trench line and the via opening.

19. The method of claim 18, wherein a barrier layer is formed on the substrate before the formation of the metal material.

* * * * *